United States Patent [19]

Miyazawa

[11] Patent Number: 5,698,909
[45] Date of Patent: Dec. 16, 1997

[54] MULTI-FUNCTION SWITCH

[75] Inventor: Yasuhiro Miyazawa, Shizuoka-ken, Japan

[73] Assignee: Yazaki Corporation, Tokyo, Japan

[21] Appl. No.: 616,643

[22] Filed: Mar. 15, 1996

[30] Foreign Application Priority Data

Mar. 22, 1995 [JP] Japan ................................ 7-062769

[51] Int. Cl.⁶ .......................................... H01H 35/02
[52] U.S. Cl. ....................... 307/116; 307/112; 323/294; 323/368; 324/207.2; 338/32 R; 338/32 H; 335/207
[58] Field of Search ........................... 307/116, 112, 307/10.1; 200/5 R; 323/294, 368; 364/424.059; 338/32 R, 32 H; 324/207.2; 335/207

[56] References Cited

U.S. PATENT DOCUMENTS

| 3,596,114 | 7/1971 | Maupin | 324/207.2 |
| 4,054,861 | 10/1977 | Markison | 338/32 H |
| 4,216,458 | 8/1980 | Edwards | 338/32 H |
| 5,159,305 | 10/1992 | Hutchison | 335/207 |
| 5,373,125 | 12/1994 | Ford et al. | 338/32 R |

FOREIGN PATENT DOCUMENTS 1-17057  5/1989  Japan .

*Primary Examiner*—Richard T. Elms
*Assistant Examiner*—Albert W. Paladini
*Attorney, Agent, or Firm*—Finnegan, Henderson, Farabow, Garrett & Dunner, L.L.P.

[57] ABSTRACT

A multi-function switch includes a casing, a key top member, two magnets, two magnetic detectors and a microcomputer. The key top member is mounted on the casing to permit both liner movement and rotational movement in a plane parallel with a bottom face of the casing. The two magnets are arranged on the key top member to be apart from each other at a predetermined distance. The two magnetic detectors are arranged on the casing to face the magnets' respectively, at respective neutral positions in the liner movement and rotational movement. The microcomputer detects a ratio of respective voltages generated from the magnetic detectors and further processes the obtained ratio as a desired operational signal.

8 Claims, 4 Drawing Sheets

MULTI-FUNCTION SWITCH

BACKGROUND OF THE INVENTION

1. Technical Field

The present invention relates to a multi-function switch which is usable in adjusting an operation of a device, such as an outside mirror, a seat of an vehicle or the like.

2. Description of the Related Art

In the related art, there is a known multi-function switch for adjusting the position of a vehicle's seat in six directions, for example. However, since this multi-function switch is constituted by a mechanical assembly to have contacts, many miss-operations have been caused in the switch due to mechanical abrasion at the contacts, adhesion of dusts or the like. Thus, the switch has been defective in both reliability and life span.

In order to overcome such problems in the multi-function switch, there has been developed a multi-function switch having no contacts.

This switch is generally composed of a member called "key top member", a casing body on which the key top member is mounted, a magnet attached so as to associate with the key top member, a compression spring arranged between the key top member and the casing body, and two Hall elements as magnetic detector, which are arranged on a base plate to oppose the magnet.

In operation, when the so-constructed switch is in a condition that no lead is exerted on the key top member, it projects from a recess of the casing body by a force of the compression spring, while a magnet case for receiving the magnet is positioned apart from the base plate at maximum distance. Therefore, a distance between the Hall elements and the magnet is also maintained to the maximum to provide an OFF state of the switch. On the contrary, when the key top member is depressed into the recess of the casing body against a force of the compression spring, then the magnet case approaches the base plate, so that the distance between the Hall elements and the magnet is shortened to provide the ON state.

That is, in the multi-function switch, when the distance between the respective Hall elements and the magnet changes from the maximum of OFF state, a turbulence is caused in magnetic flux. Then, the turbulence of magnetic flux is detected by the Hall elements for generating voltages, respectively. A micro computer operates to calculate a ratio of one voltage to the other voltage and generates a desired operational signal corresponding to the resulting ratio to a relay for driving a motor.

In the above mentioned "contact-less" multi-function switch, however, the possible manipulation is limited to a single simple action to press the key top member. Therefore, the switch is also defective in short function.

SUMMARY OF THE INVENTION

It is therefore an object of the present invention to provide a multi-function switch which is capable of effecting many functions and improving the reliability. The object of the present invention described above can be accomplished by a multi-function switch comprising:

a casing in form of a box having an opening;

a key top member mounted on the casing so as to permit both liner movement and rotational movement in an imaginary plane parallel with a bottom face of the casing;

at least two magnets arranged on either one of the key top member and the casing to be apart from each other at a predetermined distance;

at least two magnetic detectors arranged on the other of the key top member and the casing to face the two magnets respectively, at respective neutral positions in the liner movement and rotational movements, the magnets converting magnetic flux of the magnets into voltage; and control means for detecting a ratio of respective voltages generated from the magnetic detectors and sequent processing the obtained ratio as a desired operational signal.

According to the present invention mentioned above, by the provision of the control means for detecting a ratio of respective voltages generated from the magnetic detectors and sequent processing the obtained ratio as the desired operational signal, the switch is turned to OFF state when the key top member is in its neutral position, while the switch is turned to ON state when the key top member moves linearly or rotates out of the neutral position. That is, in the ON state of the switch, the relative position between the magnets and the magnetic detectors is changed by the linear movement or the rotational movements of the key top member out of the neutral position, so that different voltages are produced in the two magnetic detectors, respectively. Then, the control means detects a ratio of the respective and operates to process the obtained ratio as the desired operational signal. Since the key top member is mounted on the casing so as to move linearly and rotate, the ratio of the voltages differs from the linear movement of the key top member to the rotational movements or differs from forth motions of these movements to back motions thereof, whereby it is possible to obtain operational signals of kinds corresponding to the number of the different ratios. In this way, these operational signals allow a relay to be driven thereby to activate a desired device.

In the present invention, preferably, the key top member has a plurality of movable guide holes formed to have substantially oval cross sections, while the casing has a plurality of immovable guide holes formed in opposite positions of the movable guide holes so as to cross the movable guide holes, respectively. Under such a condition, the multi-function switch further comprises a plurality of guide levers pivotably mounted on the casing so as to guide the linear movement and rotational movement of the key top member and each of the guide levers has a guide pin which is inserted into the movable guide hole and the immovable guide hole in common so as to move therein.

In the above mentioned preferred embodiment, since the guide levers are provided for purposes of guiding the linear and rotational movements, the moving trace of the key top member can be stabilized to realize accurate operational signals.

Preferably, the casing is provided with a guide plate which has concave parts of substantial V-shaped cross sections, the concave parts being arranged in opposite positions of the immovable guide holes respectively and facing an interior of the casing, and each of the guide levers further includes a pivot plate arranged so as to pivot between the guide plate and the casing, the pivot plate having the guide pin standing thereon, and a flexible pin arranged on the opposite side of the guide pin and mounted on the guide lever in a manner that a tip of the flexible pin abuts on one of the concave parts elastically.

In the above case, since the guide levers for guiding the linear and rotational movements of the key top member are elastically attached on the concave parts of V-shaped cross sections through the intermediary of the flexible pins respectively, each of the flexible pins is positioned at each root of the concave parts when the key top member is in its neutral position. On the other hand, when the key top member moves from the neutral position, the flexible pin is slid on a slanted face of the concave part, while the guide lever is also moved to the same direction as that of the key top member. Accordingly, the key top member can be maintained in the neutral position stably. After the guide lever's movement, a return force will be applied on the key top member through the guide lever since the flexible pin then comes into elastic contact with the slanted face of the concave part. Thus, it is possible to return the key top member to the neutral position automatically by releasing a load exerted thereon.

It is preferable that the movable guide holes and the immovable guide holes constitute a slide guide section for guiding the liner movement of the key top member and two rotation guide sections arranged on both sides of the slide guide part for guiding the rotational movements of the key top member.

With the arrangement, since the multi-function switch is constructed in such a manner that the movable guide holes and the immovable guide holes in the plural opposing relationships provide the slide guide section for guiding the liner movement of the key top member and the two rotation guide sections arranged on both sides of the slide guide part for guiding the rotational movements of the key top member, it is possible to obtain six kinds of operational signals by moving the key top member to six different directions in total: two directions of the linear reciprocating motions by the slide guide section of the switch and four directions of the rotational reciprocating motions by the rotation guide sections.

More preferably, the magnets are arranged in the key top member while the magnetic detectors are arranged in the casing.

In this case, it is possible to prevent leads of the magnetic detectors from breaking down due to an interference of the leads to each other and their folds during operating the key top member and to ensure smooth motions of the key top member.

Note, in the above mentioned invention, the control means may comprises a micro computer. Further, the magnetic detectors may be Hall elements.

The above and other features and advantages of the present invention will be more apparent, and the invention itself will best be understood, from a study of the following description and appended claims, with reference to the attached drawings showing a preferred embodiment of the invention.

DESCRIPTION OF THE PREFERRED EMBODIMENT

Figure 1:
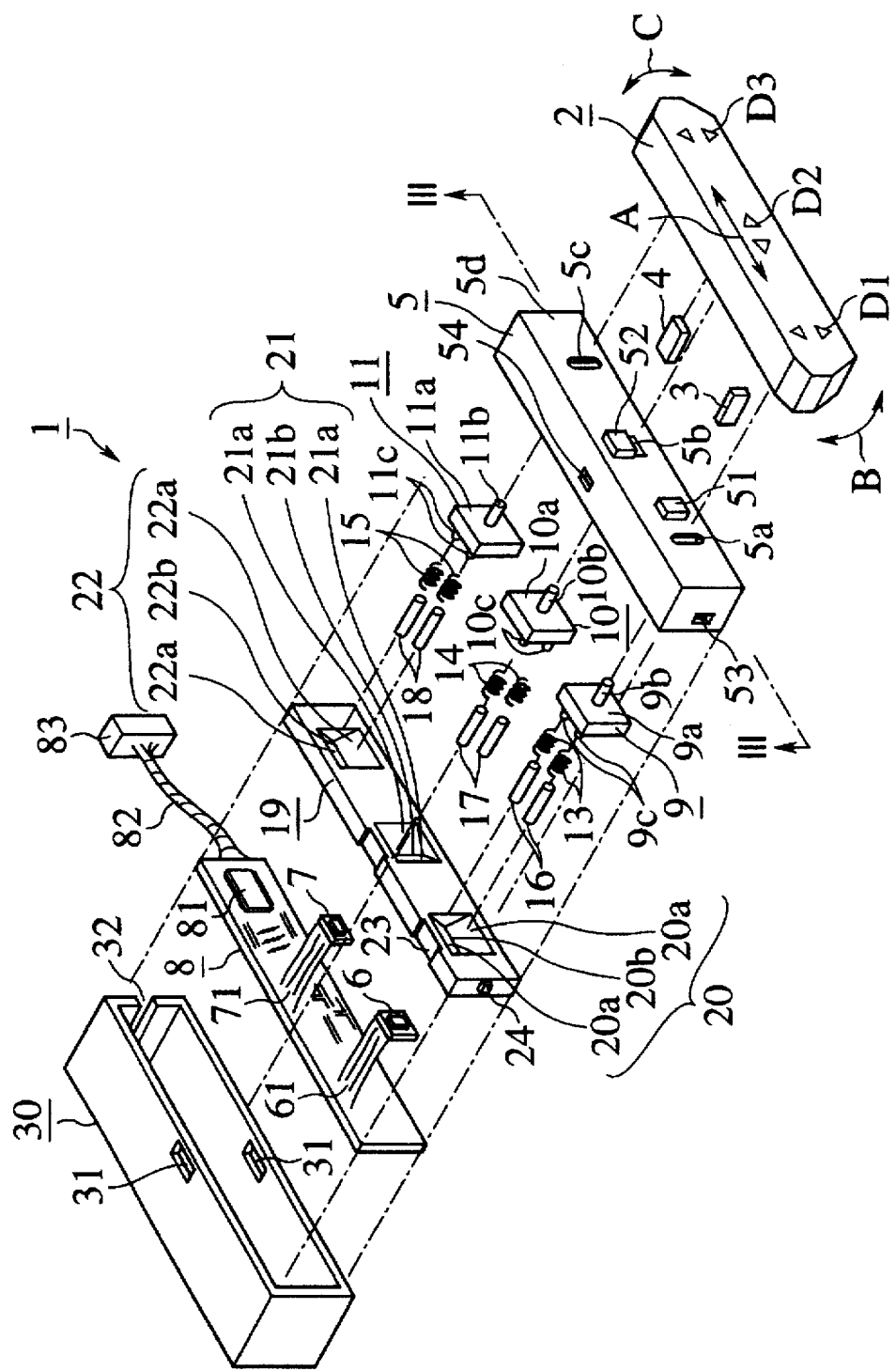
FIG. 1 is an exploded perspective view of a multi-function switch in accordance with an embodiment of the present invention.
Figure 2A:
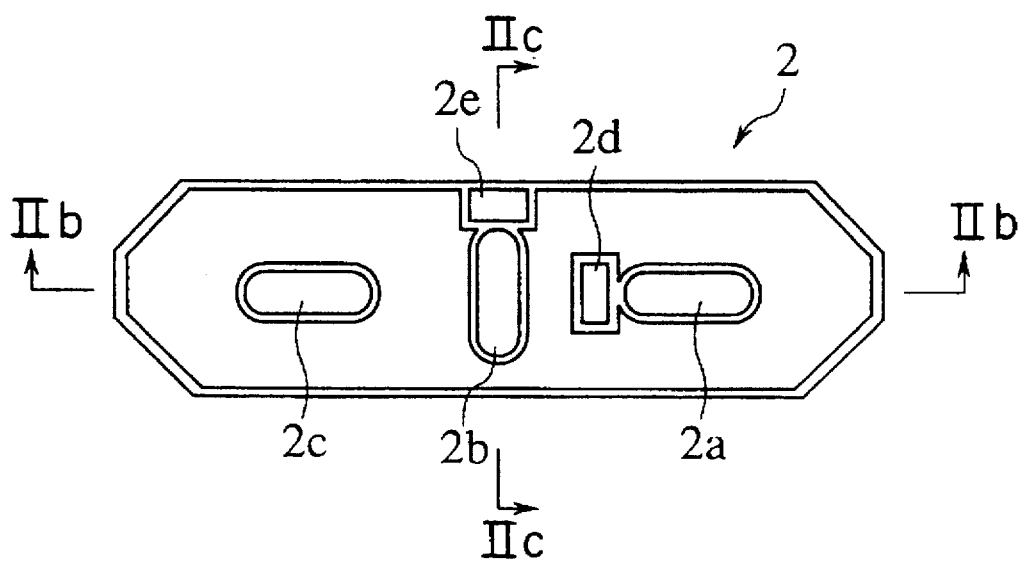
FIG. 2A is a back view of a key top member used in the multi-function switch of FIG. 1.
Figure 2B:
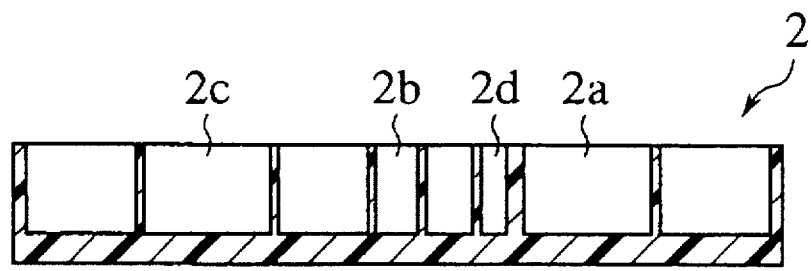
FIG. 2B is a cross sectional view of the key top member, taken along a line 11b—11b of FIG. 2A.
Figure 2C:
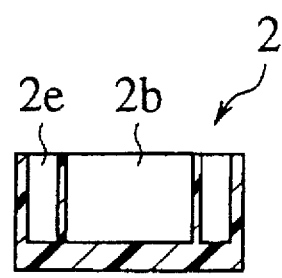
FIG. 2C is a cross sectional view of the key top member, taken along a line 11c—11c of FIG. 2A.
Figure 3:
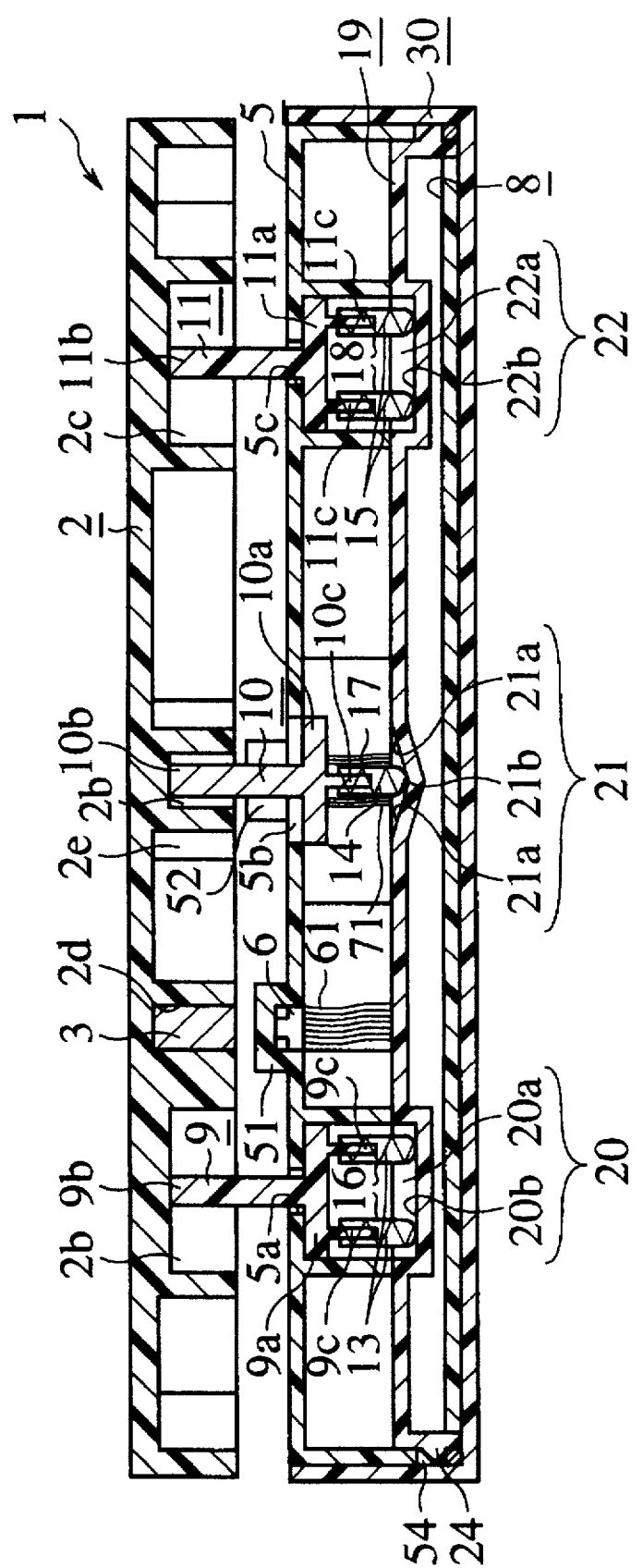
FIG. 3 is a perspective view showing the assembled multi-function switch of the embodiment, taken along a line III—III of FIG. 1.

An embodiment of the present invention will be described with reference to the drawings. FIGS. 1 to 3 shows a multi-function switch 1 in accordance with one embodiment of the present invention. The multi-function switch 1 includes a member 2 having control keys formed on a top face thereof, which will be referred to "key top member" hereinafter, two magnets 3, 4 and an inner casing 5.

The key top member 2 is mounted on the inner casing 5 so as to permit a liner movement A and rotational movements B, C in an imaginary plane parallel with a bottom face 5b of the inner casing 5 opposing to the key top member 2. The magnet 3,4 are arranged in the key top member 2 to be apart from each other at an appropriate distance. The switch 1 further includes two Hall elements 6, 7 as magnetic detector 5, which are arranged in the casing 5 so as to face the magnets 3, 4 respectively, and a micro computer 81 as control means for detecting a ratio of voltage generated from the Hall element 6 to other voltage generated from the Hall element 7 and then processing the resulting ratio as a desired operational signal.

The key top member 2 is constituted by an elongated plane body provided with a hollow back. In FIGS. 2A, 2B, 2C, a first movable guide hole 2a, a second movable guide hole 2b, a third movable guide hole 2c and mount holes 2d, 2e for magnets 3, 4, are formed in the hollow back of the key top member 2. On a top face of the key top member 2, design marks D1, D2, D3 are formed to show respective operating directions of the key top member 2.

The design marks D1, D3 are provided in form of arrows to express the rotational movements B, C of the key top member 2 respectively, while the design mark D2 is also formed to express the linear movements A. Integrated with the key top member 2, the first, second, third guide holes 2a, 2b, 2c are formed to have cylindrical bodies of substantial oval cross-section. The second guide hole 2b is positioned at a substantial center of the key top member 2 in a manner that a longitudinal axis of the hole 2b is in alignment with the width (vertical) direction of the key top member 2, while the first and third guide holes 2a, 2c are positioned on both sides of the hole 2b in a manner that respective longitudinal axes of the holes align with the length (transverse) direction of the key top member 2. Further, the mount holes 2d, 2e formed as rectangular cylindrical bodies are arranged adjacent to the guide holes 2a, 2b respectively, integrated with the key top member 2.

The magnets 3, 4 are shaped to be substantially rectangular and secured in the mount holes 2d, 2e, respectively.

The inner casing 5 is composed of an elongated rectangular box of length substantially equal to that of the key top member 2, having an opening on the opposite side of the bottom face 5d opposing the key top member 2. The inner casing 5 has first, second, and third immovable guide holes 5a, 5b, 5c which are oval-shaped on a bottom of the casing, and two recesses 51, 52 which are also formed on the bottom for receiving the Hall elements 6, 7, respectively. The first, second, third immovable guide holes 5a, 5b, 5c are arranged in opposite positions of the first, second, third movable guide holes 2a, 2b, 2c of the key top member 2 so as to be perpendicular to the holes 2a, 2b, 2c, respectively.

In other words, the second immovable guide hole 5b is arranged in the vicinity of a center of the bottom of the inner casing 5 so that a longitudinal axis of the hole 5b coincides with the length direction of the inner casing 5, while the first, third immovable guide holes 5a, 5c are arranged on both sides of the hole 5b so that respective longitudinal axes of the holes 5a, 5c coincide with the width direction of the inner casing 5.

The recesses 51, 52 forming projections on the bottom face 5d of the inner casing 5 are adapted so as to allow the Hall elements 6, 7 to be attached from the interior side of the inner casing 5. These recesses 51, 52 are arranged in opposite positions of the mount holes 2d, 2e of the key top member 2, respectively.

The Hall elements 6, 7 are connected to a print board 8 through leads 61, 71, respectively. Owing to the flexibility of the leads 61, 71, the elements 6, 7 are adapted so as to be attachable in the recesses 51, 52 with sufficient degrees of freedom in attachment.

Electrically connected to the Hall elements 6, 7, a micro computer 81 is mounted on the print board 8 electrically connected to a connector 83 through lead lines 82.

We now describe a pivotal mechanism of the multi-function switch 1 for moving and rotating the key top member 2.

The mechanism consists of first, second and third guide levers 9, 10, 11 and a guide plate 19.

The first guide lever 9 comprises a rectangular pivot plate 9a, a guide pin 9b standing on a side face of the pivot plate 9a at the substantial center, two mount pins 9c, 9c standing on the other side face in series along a center line of the pivot plate 9a and flexible pins 16, 16 elastically attached on the mount pins 9c, 9c through compression springs 13, 13, respectively. Similarly, the second and third guide levers 10, 11 respectively comprise pivot plates 10a, 11a, guide pins 10b, 11b, mount pins 10c, 11c, compression springs 14, 15, and flexible pins 17, 18.

The guide plate 19 in form of an elongated rectangular plate has first, second and third concave parts 20, 21, 22 of substantial V-shaped cross sections, which are formed on the side face opposing the interior of the inner to oppose the first, second and third immovable guide holes 5a, 5b, 5c, respectively. The first, second and third concave parts 20, 21, 22 are respectively composed of opposing slanted faces 20a, 21a, 22a and roots 20b, 21b, 22b, providing V-shaped cross sections. The second concave part 21 at the center of the guide plate 19 is arranged in a manner that the root 21b coincides with the width (vertical) direction of the plate 19, while the first, third concave parts 20, 22 on both sides of the face 21 are arranged in a manner that the roots 20b, 22b coincide with the longitudinal (transverse) direction of the plate 19, respectively.

Further, the guide plate 19 is provided on a top margin thereof with grooves 23, 23 to pass the leads 61, 71 for connecting the Hall elements 6, 7 to the print board 8.

The so-formed guide plate 19 is fitted into the opening of the inner casing 2 so that the concave parts 20, 21, 22 oppose the interior of the inner casing 2. In attaching, projections 24, 24 formed on both sides of the guide plate 19 are engaged into holes 53, 53 formed on both sides of the inner casing 5.

On the other hand, the guide levers 9, 10, 11 are arranged in a manner that the respective pivot plates 9a, 10a, 11a exist between the guide plate 19 and the bottom of the inner casing 5.

That is, in the first guide lever 9, the guide pin 9b is movably inserted into the first immovable guide hole 5a and the first movable guide hole 2a while the tip of the flexible pin 16 elastically abuts on the root 20b of the first concave part 20. Similarly, in the first and second guide levers 10, 11, the guide pin 10b, 11b are movably inserted into the second and third immovable guide holes 5b, 5c and the second and third movable guide holes 2b, 2c while the tips of the flexible pins 17, 18 elastically abut on the roots 21b, 22b of the second and third concave parts 21, 22, respectively (see FIG. 3).

With the so-constructed pivot mechanism, the key top member 2 is mounted on the inner casing 5 so as to permit the liner movement A and the rotational movements B, C in the plane parallel with the bottom face 5d of the member 2.

After mounting the above-mentioned pivot mechanism, the leads 61, 71 of the Hall elements 6, 7 mounted in the recesses 51, 52 are led through the grooves 23, 23 of the guide plate 19 to a backward thereof, while the print board 8 connected to the lead 61, 71 is brought into an outer casing 30. Thereafter, the outer casing 30 is fitted to the inner casing 5, so that the multi-function switch 1 can be completed.

In the assembling, the outer casing 30 is secured to the inner casing 5 by engaging holes 31, 31 of the casing 30 with projections 54, 54 of the casing 5, respectively. The engaging holes 31, 31 are formed in the vicinity of an opening of the casing 30, while the projections 54, 54 are formed on top and bottom faces of the casing 5. The outer casing 30 has a slit 32 formed on a side wall thereof for passing the leads 82, so that the connector 83 can be arranged outside of the outer casing 30 (see FIG. 1).

Figure 4A:
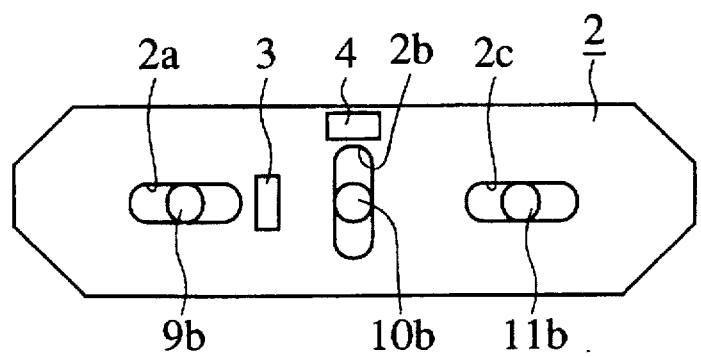
FIG. 4A is an explanatory diagram of operations of the key top member of the multi-function switch of the embodiment, showing its neutral condition.
Figure 4B:
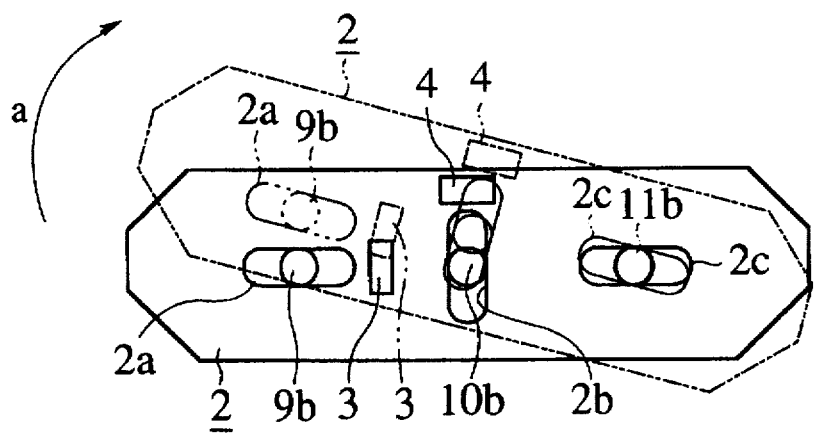
FIG. 4B is an explanatory diagram of operations of the key top member of the multi-function switch of the embodiment, showing its rotating condition to the left upward direction.
Figure 4C:
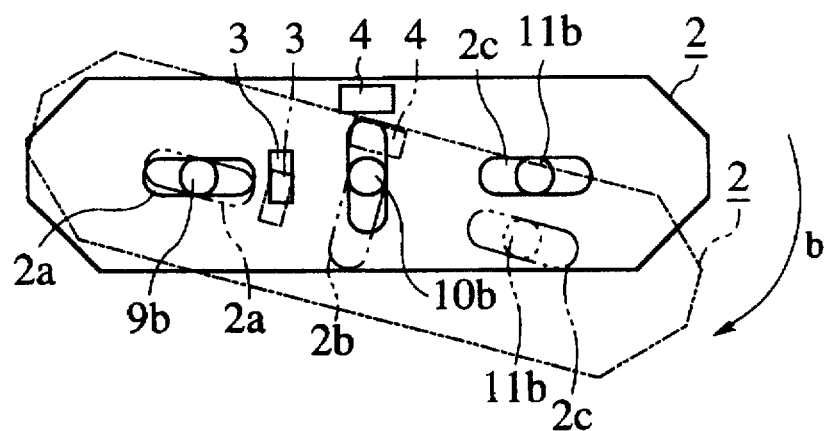
FIG. 4C is an explanatory diagram of operations of the key top member of the multi-function switch of the embodiment, showing its rotating condition to the right upward direction.

Next, we describe the operation of the multi-function switch 1 with reference to FIGS. 4A, 4B and 4C.

FIGS. 4A, 4B and 4C will be explained by way of example applying the multi-function switch 1 to a switch for adjusting a position of the vehicle seat. In this case, an upward arrow of the design mark D1 formed on the surface of the key top member 2 designates an ascent of a rear portion of the seat (rear-up) while a downward arrow designates a decent of the rear portion (rear-down). Similarly, a left arrow and a right arrow of the design mark D2 show a reversing of the seat and an advance of the seat, while upward and downward arrows of the design mark D3 show an ascent of a front portion of the seat (front-up) and a decent of the front portion (front-down), respectively (see FIG. 1).

FIG. 4A shows the key top member 2 in its neutral position. Under this condition, the magnets 3, 4 are respectively positioned to face the Hall elements 6, 7 while the tips of the flexible pins 16, 17, 18 of the guide levers 9, 10, 11 are brought into elastic contact with the roots 20b, 21b, 22b of the concave parts 20, 21, 22, respectively (see FIG. 3).

It is noted that when the key top member 2 is in the neutral position, the multi-function switch 1 is held in its OFF state.

FIG. 4B shows the above "rear-up" condition that the key top member 2 is rotated to an direction (a) in accordance with the upward arrow of the design mark D1. In the figure, a double dotted line denotes the key top member 2 after moving. This "rear-up" condition is accomplished by rotating the key top member 2 from the neutral position (shown with a full line) to the clockwise direction about the guide pin 11b. During rotation, the guide pin 9b is urged by the rotating first movable guide hole 2a to shift to the clockwise direction along the first immovable guide hole 5a, while the guide pin 10b serves to guide the displacement of the second movable guide hole 2b to the same direction without being moved. The movement of the guide pin 9b causes the whole first guide lever 9 to move, so that the flexible pins 16 of the lever 9 moves from the root 20b of the first concave part 20 to the slanted face 20b slidingly.

Under this "rear-up" condition, the relative position between the magnets 3, 4 and the Hall elements 6, 7 is changed, so that different voltages are produced in the elements 6, 7, respectively. Then, the micro computer 81 detects (calculation) a ratio of the voltage in the Hall element 6 to the same in the Hall element 7 and thereafter, it processes the obtained ratio as a "rear-up" signal. The "rear-up" signal is then inputted into a not-shown main control circuit connected to the connector 83 to drive a relay and activate a motor for raising the rear portion of the seat, which are not shown in the figure. In this way, the position of the seat can be adjusted.

After the position of the seat has been adjusted, a load exerted on the key top member 2 under the above "rear-up" condition is released. Consequently, since a return force for the neutral position is applied on the key top member 2 through the first guide lever 9 by the elastic contact of the flexible pin 16 with the slanted surface 20a, the member 2 can be returned to the neutral position automatically, whereby the switch 1 is turned to the OFF state.

FIG. 4C shows the above "front-down" condition that the key top member 2 is rotated to an direction (b) in accordance with the downward arrow of the design mark D3. Also in the figure, a double dotted line denotes the key top member 2 after moving. This "front-down" condition is accomplished by rotating the key top member 2 from the neutral position (shown with a full line) to the clockwise direction about the guide pin 9b. During rotation, the guide pin 11b is urged by the rotating third movable guide hole 2c to shift to the clockwise direction along the third immovable guide hole 5c, while the guide pin 10b serves to guide the displacement of the second movable guide hole 2b to the same direction without being moved. The movement of the guide pin 11b causes the whole third guide lever 11 to move, so that the flexible pins 18 of the lever 11 moves from the root 22b of the third concave part 22 to the slanted face 22a slidingly.

Under this "front-down" condition, since a pivot center of the key top member 2 is different from that in the "rear-up" condition, the relative position between the magnets 3, 4 and the Hall elements 6, 7 is changed differently from the change during the "rear-up" operation, so that different voltages corresponding to the above change are produced in the elements 6, 7, respectively. Then, the micro computer 81 detects a ratio of the voltage in the Hall element 6 to the same in the Hall element 7 and thereafter, it processes the obtained ratio as a "front-down" signal. The "front-down" signal is finally used to activate a not-shown motor for lowering the front portion of the seat, which is similar to the case in "rear-up" operation. In this way, the position of the seat can be adjusted.

After the position of the seat has been adjusted, a load exerted on the key top member 2 to maintain the "front-down" condition is released, similar to the "rear-up" case. Consequently, the member 2 can be returned to the neutral position automatically, whereby the switch 1 is turned to the OFF state.

Similarly, in the multi-function switch 1, when the key top member 2 is rotated to the downward arrow of the design mark D1, the "rear-down" condition to move the rear portion of the seat downwardly can be accomplished to adjust the position of the seat. In addition, when the key top member 2 is rotated to the upward arrow of the design mark D3, the "front-up" condition to move the front portion of the seat upward condition can be realized thereby to adjust the position of the seat. In these case, the switch 1 can be brought into the OFF state by returning the key top member 2 to the neutral position after adjustment.

Furthermore, in the multi-function switch 1, when the key top member 2 is slid to the left arrow of the design mark D2, the "reverse" condition of the seat can be obtained, so that it is possible to adjust the position of the seat by moving it backwardly. Similarly, when the key top member 2 is slid to the right arrow of the design mark D2, the "advance" condition of the seat can be obtained, so that it is possible to adjust the position of the seat by moving it forwardly. Also in these case, the switch 1 can be brought into the OFF state by returning the key top member 2 to the neutral position after adjustment.

That is, the forward and backward conditions can be realized by the liner movement A of the key top member 2 with the movement of the guide pin 10b of the second guide lever 10 along the second immovable guide hole 5b. On the contrary, the return of the key top member 2 to the neutral position after adjustment is automatically executed by a return force for the neutral position, which has been applied on the key top member 2 through the second guide lever 10 by the elastic contact of the flexible pin 17 with the slanted surface 21a of the second concave part 21.

As mentioned hereinabove, since the multi-function switch 1 is constructed in such a manner that the movable guide holes 2a, 2b, 2c and the immovable guide holes 5a, 5b, 5c in the opposing relationship provide one "slide" guide section for guiding the liner movement A of the key top member 2 and two "rotation" guide sections arranged on both sides of the slide guide part for guiding the rotational movements B, C of the key top member 2, it is possible to realize six kinds of operational signals by moving the key top member 2 to six directions in total, which consist of two directions of the linear reciprocating motions by the slide guide section of the switch 1 and four directions of the rotational reciprocating motions by the two rotation guide sections.

Since the so-constructed multi-function switch 1 can be constituted as a so-called "contact-less" switch, it is possible to exclude such problems of miss-operations caused by mechanical abrasion, adhesion of dusts or the like, whereby the reliability of the switch 1 can be improved.

In modifications of the multi-function switch 1, the magnets 3, 4 may be arranged in the inner casing 5 while the Hall elements 6, 7 may be arranged on the key top member 2. According to the above mentioned embodiment, however, it is possible to prevent the leads 61, 71 from breaking down due to their interference to each other and their folds during operating the key top member 2 and to ensure smooth motions of the member 2.

In addition, even if the key top member 2 is guided by the guide levers 9, 10, 11 only, the movement trace of the key top member 2 can be stabilized to obtain accurate operational signals. According to the shown embodiment, however, with the combination of the guide levers 9, 10, 11 with the guide plate 19 of the embodiment, it is possible to keep the key top member 2 in the neutral position stably and to return the member 2 to the neutral position automatically. Consequently, it is possible to manipulate the switch 1 easier and to position the member 2 at the neutral position exactly thereby to improve the reliability moreover.

Finally, it will be understood by those skilled in the art that the foregoing description is one of preferred embodiments of the disclosed multi-function switch, and that various changes and modifications may be made to the present invention without departing from the spirit and scope thereof.

What is claimed is:

1. A multi-function switch comprising:

a casing in form of a box having an opening;

a key top member mounted on said casing so as to permit both liner movement and rotational movements in an imaginary plane parallel with a bottom face of said casing;

at least two magnets arranged on either one of said key top member and said casing to be apart from each other at a predetermined distance;

at least two magnetic detectors arranged on the other of said key top member and said casing to face said two magnets respectively, at respective neutral positions in the liner movement and rotational movement, said magnets converting magnetic flux of said magnetic detectors into voltage; and control means for detecting a ratio of respective voltages generated from said magnetic detectors and sequent processing the obtained ratio as a desired operational signal.

2. A multi-function switch as claimed in claim 1, wherein said key top member has a plurality of movable guide holes formed to have substantially oval cross sections, while said casing has a plurality of Immovable guide holes formed in opposite positions of said movable guide holes so as to cross said movable guide holes, respectively.

3. A multi-function switch as claimed in claim 2, further comprising a plurality of guide levers pivotably mounted on said casing so as to guide the linear movement and rotational movement of said key top member, wherein each of said guide levers has a guide pin which is inserted into said movable guide hole and said immovable guide hole in common so as to move therein.

4. A multi-function switch as claimed in claim 3, wherein said casing is provided with a guide plate which has concave parts of substantial V-shaped cross sections, said concave parts being arranged in opposite positions of said immovable guide holes respectively and facing an interior of said casing, and wherein each of said guide levers further includes a pivot plate arranged so as to pivot between said guide plate and said casing, said pivot plate having said guide pin standing thereon, and a flexible pin arranged on the opposite side of said guide pin and mounted on said guide lever in a manner that a tip of said flexible pin abuts on one of said concave parts elastically.

5. A multi-function switch as claimed in claim 4, wherein said movable guide holes and said immovable guide holes constitute a slide guide section for guiding the liner movement of said key top member and two rotation guide sections arranged on both sides of said slide guide part for guiding the rotational movement of said key top member.

6. A multi-function switch as claimed in claim 1, wherein said magnets are arranged in said key top member while said magnetic detectors are arranged in said casing.

7. A multi-function switch as claimed in claim 6, wherein said control means comprises a micro computer.

8. A multi-function switch as claimed in claim 6, wherein said magnetic detectors are Hall elements.

* * * * *